(12) United States Patent
Patel et al.

(10) Patent No.: US 7,358,585 B2
(45) Date of Patent: Apr. 15, 2008

(54) SILICON-BASED SCHOTTKY BARRIER INFRARED OPTICAL DETECTOR

(75) Inventors: Vipulkumar Patel, Monmouth Junction, NJ (US); Margaret Ghiron, Allentown, PA (US); Prakash Gothoskar, Allentown, PA (US); Robert Keith Montgomery, Easton, PA (US); Soham Pathak, Allentown, PA (US); David Piede, Allentown, PA (US); Kalpendu Shastri, Orefield, PA (US); Katherine A. Yanushefski, Zionsville, PA (US)

(73) Assignee: SiOptical, Inc., Allentown, PA (US)

( * ) Notice: Subject to any disclaimer, the term of this patent is extended or adjusted under 35 U.S.C. 154(b) by 182 days.

(21) Appl. No.: 10/990,725

(22) Filed: Nov. 17, 2004

(65) Prior Publication Data

US 2005/0110108 A1   May 26, 2005

Related U.S. Application Data

(60) Provisional application No. 60/523,846, filed on Nov. 20, 2003.

(51) Int. Cl.
  *G02B 6/10* (2006.01)
  *H01L 31/0224* (2006.01)
(52) U.S. Cl. .............................. 257/454; 257/E29.143; 385/129
(58) Field of Classification Search ........ 257/453–456, 257/471, 473, E29.143; 385/129–132, 14
See application file for complete search history.

(56) References Cited

U.S. PATENT DOCUMENTS

| | | | |
|---|---|---|---|
| 4,857,973 A | 8/1989 | Yang et al. | |
| 5,193,131 A | 3/1993 | Bruno | |
| 5,525,828 A | 6/1996 | Bassous et al. | |
| 5,685,919 A | 11/1997 | Saito et al. | |
| 5,757,986 A | 5/1998 | Crampton et al. | |
| 5,918,143 A | 6/1999 | Beauvais et al. | |
| 5,977,603 A | 11/1999 | Ishikawa | |
| 6,233,070 B1 | 5/2001 | Lu et al. | |
| 6,338,275 B1 | 1/2002 | Soares | |
| 6,433,399 B1 | 8/2002 | Polman et al. | |
| 6,756,651 B2 | 6/2004 | Bozso et al. | |
| 7,170,142 B2 * | 1/2007 | Wojcik et al. | 257/449 |
| 2002/0079427 A1 | 6/2002 | Xu et al. | |
| 2002/0190210 A1 | 12/2002 | Ishikawa et al. | |

(Continued)

FOREIGN PATENT DOCUMENTS

| | | |
|---|---|---|
| EP | 0 993 053 A | 4/2000 |
| GB | 2 387 269 A | 10/2003 |
| WO | WO 02/31555 A2 | 4/2002 |
| WO | WO 03/060599 A2 | 7/2003 |

*Primary Examiner*—Lynne Gurley
*Assistant Examiner*—Colleen A Matthews
(74) *Attorney, Agent, or Firm*—Wendy W. Koba

(57) ABSTRACT

A silicon-based IR photodetector is formed within a silicon-on-insulator (SOI) structure by placing a metallic strip (preferably, a silicide) over a portion of an optical waveguide formed within a planar silicon surface layer (i.e., "planar SOI layer") of the SOI structure, the planar SOI layer comprising a thickness of less than one micron. Room temperature operation of the photodetector is accomplished as a result of the relatively low dark current associated with the SOI-based structure and the ability to use a relatively small surface area silicide strip to collect the photocurrent. The planar SOI layer may be doped, and the geometry of the silicide strip may be modified, as desired, to achieve improved results over prior art silicon-based photodetectors.

19 Claims, 10 Drawing Sheets

U.S. PATENT DOCUMENTS

| | | |
|---|---|---|
| 2003/0109142 A1 | 6/2003 | Cable et al. |
| 2004/0165807 A1 | 8/2004 | Liu |
| 2004/0173865 A1 | 9/2004 | Scales et al. |
| 2004/0190829 A1 | 9/2004 | Liu et al. |
| 2004/0213497 A1 | 10/2004 | Liu |
| 2004/0213507 A1 | 10/2004 | Liu |
| 2004/0218852 A1 | 11/2004 | Liu et al. |
| 2004/0218868 A1 | 11/2004 | Liu |

* cited by examiner

SILICON-BASED SCHOTTKY BARRIER INFRARED OPTICAL DETECTOR

CROSS-REFERENCE TO RELATED APPLICATION

This application claims the benefit of Provisional Application No. 60/523,846, filed Nov. 20, 2003.

TECHNICAL FIELD

The present invention relates to a silicon-based Schottky barrier infrared (IR) optical detector and, more particularly, to a planar, waveguide-based IR optical detector with sufficiently low dark current to operate efficiently at room temperature.

BACKGROUND OF THE INVENTION

Semiconductor devices using metal-semiconductor barriers (referred to as Schottky barriers) instead of p-n junctions have been developed to convert incident light into electrical energy. Silicon is often used as the semiconductor material in Schottky barrier photodetectors operating in the IR portion of the electromagnetic energy spectrum. In its most conventional form, a silicon-based Schottky barrier photodiode consists of a thin metallic film (such as a silicide film) disposed on a silicon layer. Incident light is applied perpendicular to (i.e., "normal to") this structure, passing through the relatively thin metallic film, where the thin film absorbs only a portion of the light, thus resulting in extremely low external quantum efficiency levels. As a result, conventional "normal incidence" photodetectors require a relatively large active detection area in order to collect a sufficient amount of optical energy to properly function. However, as the detection area increases, the dark current (unwanted noise signal) increases as well. Moreover, while relatively simple in structure, such normal incidence detectors typically require cooling, again associated with a relatively high dark current value.

Improvements in optical absorption and quantum efficiency in silicon-based Schottky barrier photodetectors have been the source of much investigation over the years. In one case, the optical absorption has been improved by inducing a surface plasmon mode at the metal-semiconductor interface, as disclosed in U.S. Pat. No. 5,685,919 issued to K. Saito et al. on Nov. 11, 1997. In this arrangement, a semicylindrical lens is disposed over the metallic layer and used to re-orient the incoming light from normal incidence to an angle associated with creating the surface plasmon layer. U.S. Pat. No. 4,857,973, issued to A. C. Yang et al. on Aug. 15, 1989 discloses an alternative Schottky barrier photodetector arrangement, where the photodetector is monolithically integrated with a single crystal silicon rib waveguide and positioned to absorb the "tail" of the optical signal as it passes along the rib waveguide underneath a silicide layer. While an improvement in absorption efficiency may be achieved with the Yang et al. structure, significant losses remain in terms of scattering losses along the sidewalls of the rib waveguide structure inasmuch as the rib is created by partially removing portions of a relatively thick silicon layer. Moreover, significant difficulties remain in terms of controlling the dimensions (particularly the height), as well as the smoothness, of such a rib waveguide structure. Indeed, the implementation of such a "rib" structure (particularly with sub-micron dimensions) is extremely difficult with CMOS-based conventional processing technologies. Further, the non-planar geometry of the Yang et al. structure is not considered as a preferred arrangement from a manufacturing point of view, particularly in terms of the reliability and robustness of the design.

In view of the potential advantages of a silicon-based Schottky barrier photodetector, it would be very advantageous to provide a relatively simple device with high quantum efficiency and fast responses that could be fabricated using CMOS-compatible planar processes and materials without requiring a significant investment in capital or technical resources.

SUMMARY OF THE INVENTION

The need remaining in the prior art is addressed by the present invention, which relates to a silicon-based Schottky barrier infrared (IR) optical detector and, more particularly, to a planar, waveguide-based IR optical detector with sufficiently low dark current so as to operate efficiently at room temperature.

In accordance with the present invention, a silicide layer (or other appropriate metallic layer) is disposed over a planar silicon waveguide layer formed as a sub-micron thick surface layer of a "silicon-on-insulator" (SOI) structure (this sub-micron surface waveguide layer often referred to in the art as the "SOI layer"). Ohmic contacts are applied to both the planar SOI layer of the SOI structure and the silicide layer. An optical signal propagating laterally along the optical waveguide within the planar SOI layer will thus pass under the silicide layer, where the "tail" of the optical energy will intercept the silicide and be converted into electrical energy. Since the arrangement of the present invention is based on implementing a silicide detector on planar silicon surfaces and does not require the formation of a single crystal silicon rib waveguide, significant improvements in efficiency over the structure of Yang et al. can be realized, where the structure of the present invention is also extremely compatible with conventional planar CMOS processing technologies.

In various embodiments of the present invention, the planar SOI layer may be doped to improve the effective collection efficiency of the photo-generated carriers, as well as the speed and responsivity of the detector. Further, a guard ring structure may be incorporated with the detector and used to minimize the generation of dark current. The waveguide structure itself may be modified to form various preferred geometries, such as (but not limited to) Y-splitters, ring resonators, coupled waveguide configurations, taps, etc. to optimize the overall detector performance within the optical system. The overlying silicide strip may be formed to include a tapered input region to minimize optical signal reflections.

Other and further embodiments and features of the present invention will become apparent during the course of the following discussion and by reference to the accompanying drawings.

BRIEF DESCRIPTION OF THE DRAWINGS

Referring now to the drawings.

DETAILED DESCRIPTION

As described above, the present invention is directed to a monolithically integrated, planar Schottky barrier infrared waveguide detector capable of operating below, at or above room temperature. Advantageously, the fabrication process and materials of the inventive detector are compatible with conventional, planar CMOS process technology associated with the semiconductor industry.

In accordance with the present invention, a Schottky barrier junction is formed on the sub-micron thick, planar silicon waveguiding surface layer ("SOI layer") of an SOI structure. This Schottky barrier junction is formed in such a way that the optical signal propagating laterally along a waveguide within the planar SOI layer (traveling in the direction parallel to the junction) is continuously absorbed into the overlying silicide layer as it passes thereunder. As a result of this geometry, even a relatively thin silicide layer (e.g., a few monolayers thick) will absorb a large portion of the signal over a distance of a few microns. Thus, the thickness of the absorbing silicide layer can be optimized to achieve very high internal photoemission efficiency across the Schottky barrier junction. In particular, the thickness of the absorbing silicide layer can be optimized by adjusting the length of the detector and the optical light intensity in the vicinity of the silicide layer. Additionally, the silicide layer should be disposed away from any sharp corners/edges, as well as rough-surfaced etched silicon regions. This positioning is preferred so as to reduce dark current generation. The dark current of the detector can be further reduced by designing the detector to absorb the desired optical signal in the minimum possible area. In most cases, the Schottky barrier photodetector is operated in a reverse-biased mode so as to generate a useful electrical signal output. Operation in avalanche mode is also possible.

Figure 1:
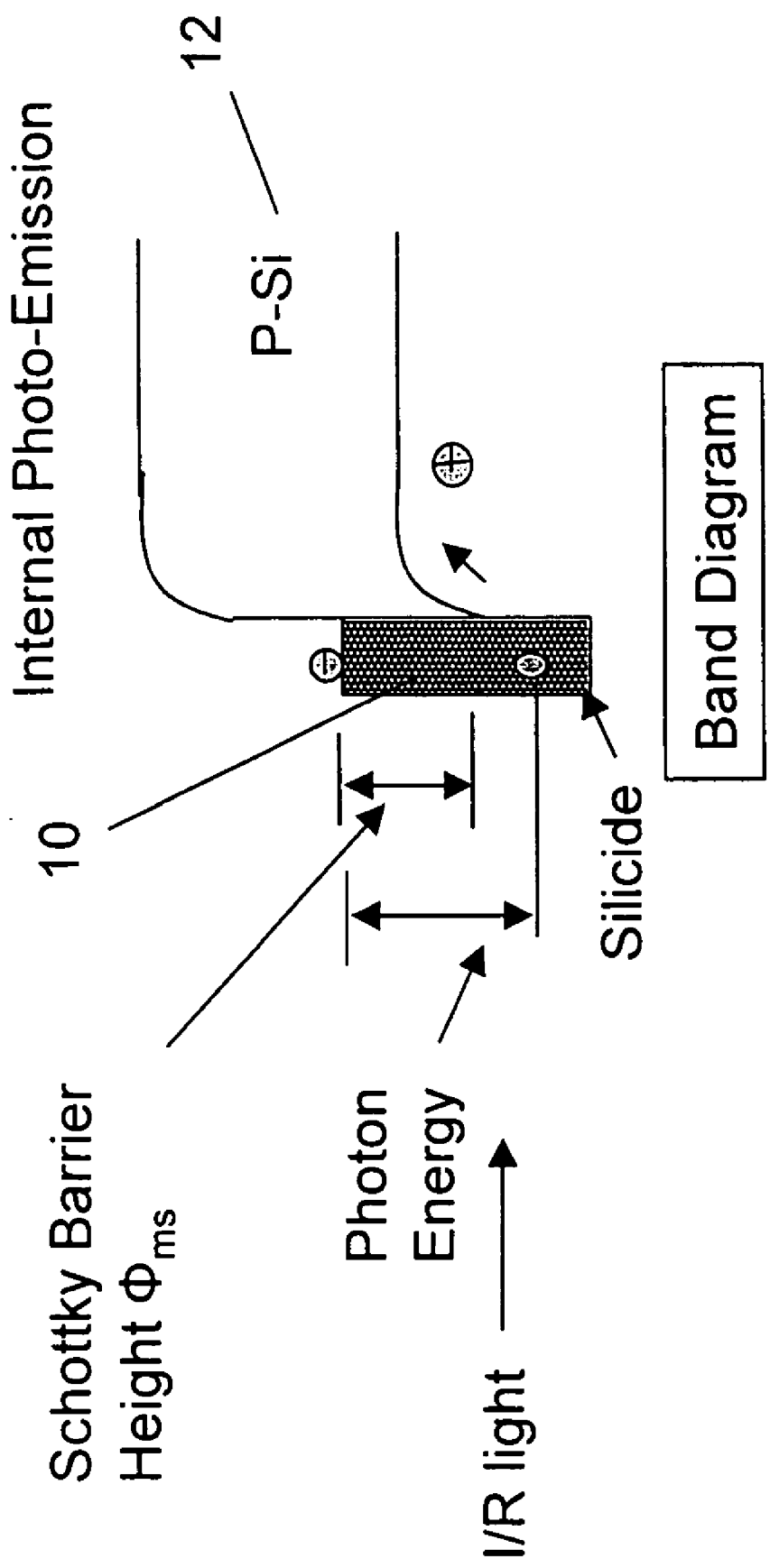
FIG. 1 is a band diagram associated with the operation of a prior art, normal incidence, Schottky barrier photodetector.

The basic operation of a conventional, prior art "normal incidence" Schottky-barrier infrared photodetector is first described so as to form a basis for distinguishing the subject matter of the present invention. Referring to FIG. 1, an energy band diagram is illustrated to describe the operation of such a conventional Schottky-barrier photodetector. The incoming infrared radiation is incident in a normal incidence manner on a silicide layer 10 and results in the excitation of a photocurrent across the Schottky barrier (defined as having a barrier height $\phi_{ms}$) by internal photoemission into an underlying silicon layer 12. In the arrangement of FIG. 1, it is presumed that silicon layer 12 comprises a p-type silicon material. Since silicon itself is transparent to IR radiation with a photon energy less than the band gap of silicon (1.12 eV), silicon layer 12 does not contribute to the photocurrent by absorption of infrared photons (through the creation of electron-hole pairs). Particularly, the infrared photons are absorbed into silicide layer 10 by transferring their energy and momentum to the free carriers. Indeed, the "hot" holes (or "hot" electrons when using an n-type layer) that have sufficient energy, as well as the requisite directional properties, will go over the Schottky barrier and are injected into silicon layer 12, leaving a net negative (positive) charge on the silicide electrode.

For a conventional, prior art normal incidence Schottky barrier photodetector, the responsivity of the detector can be optimized by performing a trade-off between the gain and absorption qualities, where both the gain and absorption are dependent on the wavelength at which the photodetector is operated. The gain represents the escape (emission) probability of a "hot" hole over the Schottky barrier. When a photon with an energy greater than the Schottky barrier height is absorbed into the silicide layer by the process of free carrier absorption, the hole gains energy and becomes "hot". The term "hot" hole refers to a hole with a finite probability of emission over the Schottky barrier. The initial energy of a "hot" hole is proportional to the absorbed photon. Due to semi-elastic scattering events and reflections from the silicide boundaries, the "hot" hole loses energy and changes direction of travel. When the energy, position and direction of travel for a "hot" hole satisfies the condition of emission over the Schottky barrier, the hole is emitted over the barrier and produces a proportional photocurrent. If, during the process of a "hot" hole becoming a "cold" hole (i.e., a hole with a zero probability of travel as a result of semi-elastic collisions and reflections), the condition of emission is not satisfied, then the "hot" hole will not be emitted over the barrier and no photocurrent will be generated.

The absorption of a photodetector is defined as the percentage of incident photons that are absorbed into the silicide layer. The increase in injection efficiency as a result of "hot" hole scattering (reflection) at the silicide-dielectric interface (or silicide grain boundary) is referred to as the "internal quantum efficiency gain". For the sake of simplicity, this quantity will hereafter be referred to simply as "gain".

For a conventional, normal incidence photodetector of the prior art, a fraction of the total incident photon flux is reflected from boundaries between the various materials of the structure, since each material exhibits different optical properties. Further, a significant portion of the photon flux reaching the silicide layer may be transmitted directly through the silicide layer, without being absorbed, if the silicide layer is relatively thin. Thus, for a normal incidence detector, the absorption in the silicide layer increases exponentially with the thickness (or distance traveled in the absorbing silicide layer).

In contrast, the gain of the photodetector may be increased by reducing the thickness of the silicide layer. An approximate formula for the gain as a function of wavelength can be expressed as follows:

$$Gain(\lambda) = sL/t,$$

where L is defined as the mean free path of holes projected on the direction normal to the surface of the silicide, t is defined as the thickness of the silicide layer, and s is a constant associated with the wavelength ($\lambda$). Therefore, by reducing the thickness t of the silicide layer with respect to the mean free path length L, the gain factor can be increased significantly, due to the increased probability of "hot" hole injection over the barrier as a result of scattering and multiple reflections from the silicide boundaries.

Therefore, in a conventional, normal-incidence photodetector, a compromise is generally made between the photoemission gain and the total absorption when determining the thickness for the silicide layer. Using a relatively thin silicide layer in a conventional normal-incidence photodetector results in generating high photoemission gain. However, the thin silicide layer will absorb only a small fraction of the incident infrared optical signal. As a result, independent optimization of the gain and absorption is not possible in a conventional detector, and the silicide layer is thus required to have a certain minimum thickness in order to absorb a sufficient amount of the input signal to form a useful photodetector.

In addition, the dark current density of a conventional, normal incidence Schottky barrier detector is a very strong function of both the barrier height and the operating temperature. For such a photodetector, the operating temperature can be calculated assuming a maximum allowable noise equivalent dark current density of $10^{-7}$ A/cm², where Table I (below) is a chart of the Schottky barrier spectral response/ operating temperature trade-off for this dark current density, as calculated for a variety of different silicide materials.

| Silicide | $\phi_{ms}$ (in eV) (p-type Si) | Cutoff $\lambda_c$ (in μm) | Max. Operating Temp. (in °K) $J_d = 1 \times 10^{-7}$ A/cm² |
|---|---|---|---|
| IrSi | 0.18 | 7.00 | 55-65 |
| PtSi | 0.20 | 6.00 | <90 |
| Pt$_2$Si | 0.35 | 3.65 | 140 |
| Pd$_2$Si | 0.34 | 3.60 | 145 |
| NiSi | 0.46 | 2.70 | 180 |
| CoSi | 0.45 | 2.80 | 170 |
| WSi | 0.47 | 2.64 | 185 |
| TiSi | 0.52 | 2.40 | 200 |

In order to improve the performance of the Schottky barrier IR detector to detect radiation in the 1.10-1.65 μm band of interest for optical communications, the present invention proposes the use of a lateral incidence photodetector in place of the conventional normal incidence photodetector structure, the inventive lateral incidence photodetector formed as an integral part of an SOI structure including a sub-micron surface layer waveguide. At least one prior art lateral incidence arrangement has been reported (see the Yang et al. patent referenced above), but the Yang et al. work relies on the use of a finely-etched rib waveguide structure, thus limiting the performance results of the photodetector (attributed, at least in part, to the inability to etch a micron-sized structure with precision as well as the presence of scattering loss from the sides of the rib structure). Indeed, as mentioned above, the Yang et al. structure is considered to be incompatible with conventional planar CMOS processing techniques.

Figure 2:
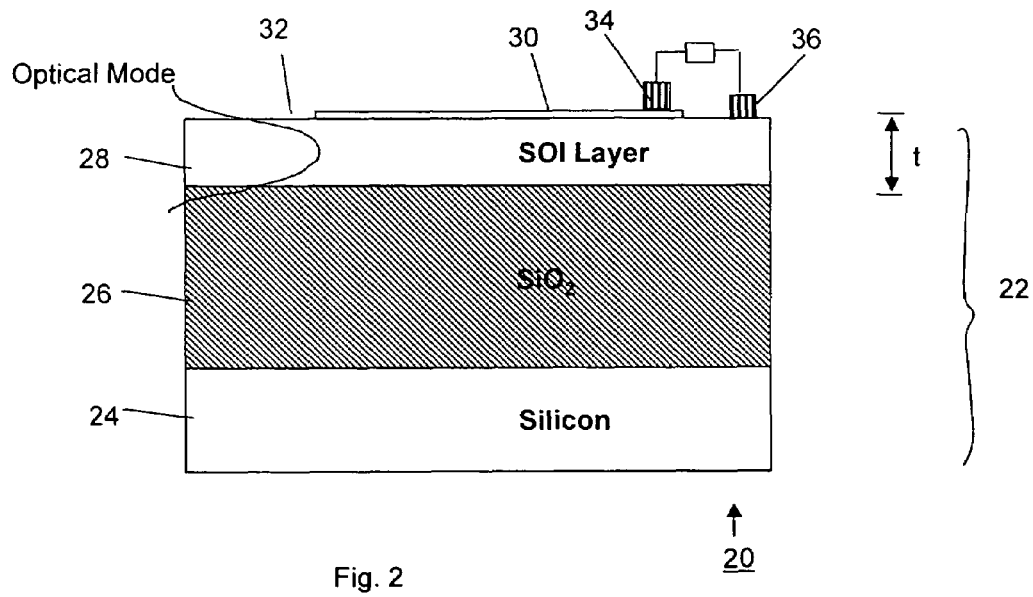
FIG. 2 is a cut-away side view of an exemplary SOI-based silicon photodetector formed in accordance with the present invention.
Figure 3:
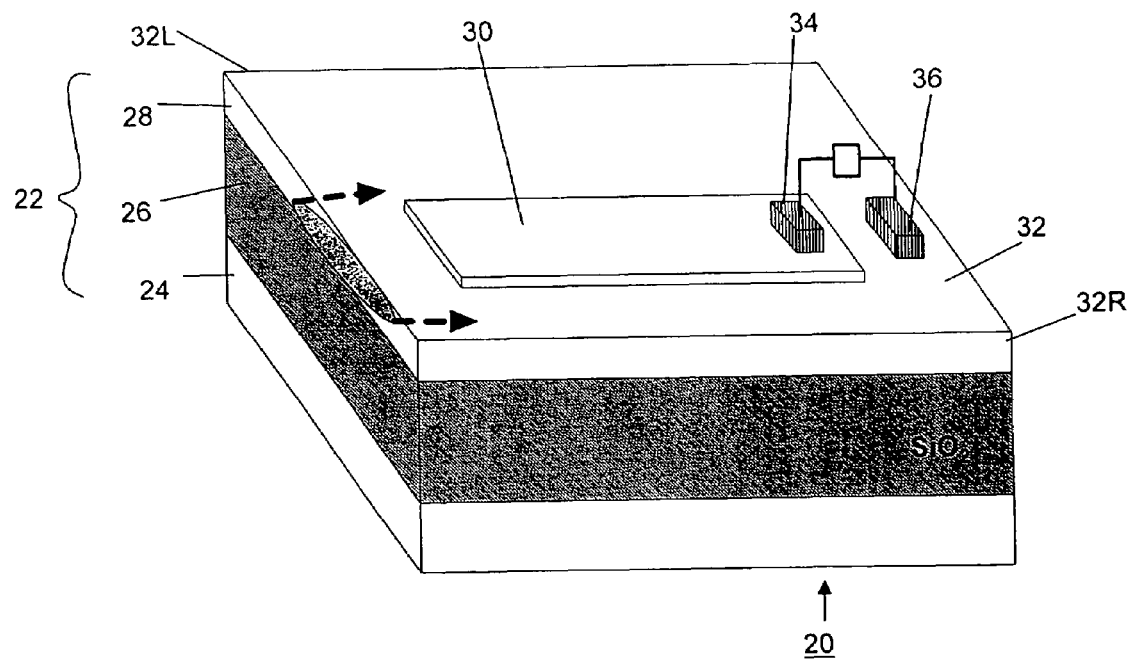
FIG. 3 is an isometric view of the exemplary photodetector of FIG. 2.

FIG. 2 contains a side view of an exemplary Schottky barrier IR photodetector arrangement 20 formed in accordance with the present invention, with an isometric view contained in FIG. 3. Photodetector 20 comprises a conventional "silicon-on-insulator" (SOI) structure 22, including a silicon substrate 24, insulator layer 26 (usually of SiO$_2$) and a planar silicon surface layer 28, where planar silicon surface layer 28 is preferably formed to have a thickness of less than one micron and is used to support the propagation of an optical mode therealong, as shown in FIG. 2. It has become generally accepted practice in this art to refer to the planar waveguiding silicon surface layer of an SOI structure as the "SOI layer". Thus, throughout the course of this discussion, planar silicon surface layer 28 will generally be referred to as planar SOI layer 28. It is to be understood that this surface silicon layer may comprise either a planar single crystal silicon or a planar crystalline silicon (or Si—Ge) layer that has been processed to be in a "strained" lattice state (the strained silicon layer exhibiting a higher mobility rate for the carriers by reducing the mean free path length L).

In order to form the metal-semiconductor interface required for a Schottky barrier, a silicide strip 30 is disposed along a portion of top surface 32 of planar SOI layer 28. In practice, any one of the silicides that forms an appropriate Schottky barrier for the wavelength to be detected may be used in the formation of this structure, since the ability to form a silicide on a silicon surface is generally understood in the planar CMOS processing industry. In a typical silicide formation process, a thin metal layer is deposited on a pre-cleaned silicon surface and then reacted with silicon at a specific temperature(s) under controlled ambient conditions to form a silicide with specific electrical properties (e.g., resistance) and physical properties (e.g., crystal structure, grain size). The unreacted metal layer is then removed using an etch process, leaving only the silicide strip on the silicon surface. In accordance with the present invention, silicides based on cobalt, nickel, molybdenum, tantalum, tungsten and titanium are the most desired silicide layers for telecommunications application (and are also compatible with CMOS processes). The typical thickness for a silicide strip 30 of the present invention is on the order of, for example, 5-30 Å. Silicide strip 30 may be formed as a single crystal (which is possible with some silicides), or as a polycrystalline material. For a polycrystalline silicide strip, scattering from grain boundaries plays a role (in association with the strip thickness) in determination of the "gain" factor of the detector. In this case, the processing conditions can be controlled, using well-known means, to optimize the grain formation in the silicide.

A first electrical contact 34 is made to silicide strip 30 so as to form a first electrode of photodetector 20. A second electrical contact 36 is made directly to planar SOI layer 28 along its top surface 32, where first and second contacts 34, 36 are illustrated in both FIGS. 2 and 3. Thus, as an optical beam propagates along planar SOI layer 28, the "hot" carriers injected from silicide strip 30 will result in the generation of a photocurrent between first electrical contact 34 and second electrical contact 36, where a measurement of this photocurrent can then be used as an indication of the optical power of the propagating lightwave signal. An important aspect of the present invention that may be best understood by referring to FIG. 3 is the need to keep silicide strip 30 distanced from the edges 32-L and 32-R of planar SOI layer 28. By avoiding the overlap of silicide strip 30 with the sharp corners and edges of SOI layer 28, the dark current is significantly reduced. Indeed, the structure of the present invention has been found to reduce the dark current to a level such that room temperature operation of the photodetector is possible—a significant improvement over the prior art.

Referring again to FIG. 3, contacts 34 and 36 are each illustrated as comprising a relatively thick silicide layer, as in conventional CMOS contact structures. In a preferred embodiment of the present invention, contacts 34 and 36 are positioned away from the high optical field region, in order to minimize the absorption of the optical signal into the contact structure. The arrangement of FIG. 3 includes contacts 34 and 36 disposed at the rear portion of the detector structure (thus positioned beyond the region where the optical signal is absorbed into the silicide), where this arrangement is considered to be exemplary only, with other contact schemes capable of minimizing the optical absorption in the contact region is considered to be possible and within the scope of the present invention. Additionally, by virtue of using a planar SOI layer, contacts 34 and 36 are disposed at essentially the same height above top surface 32 of planar SOI layer 28.

Figure 4:
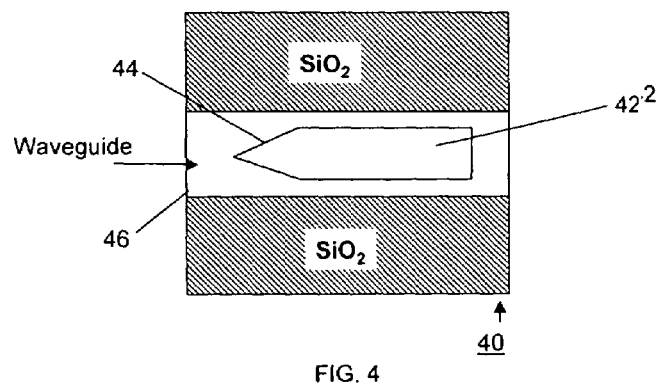
FIG. 4 is a top view of an alternative SOI-based silicon photodetector of the present invention, using a tapered silicide strip to reduce optical signal reflections.
Figure 5:
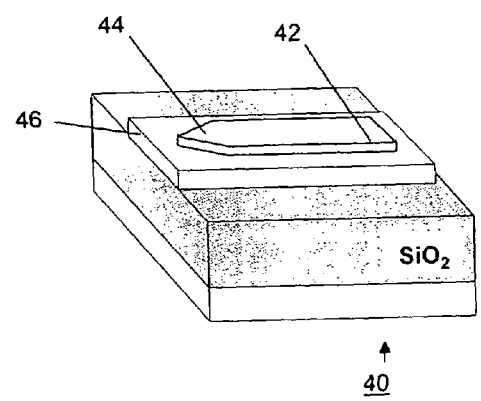
FIG. 5 is an isometric view of the tapered silicide photodetector of FIG. 4.

In order to reduce the generation of a reflected signal as the propagating optical mode encounters the Schottky barrier (that is, the overlying silicide strip), the silicide strip may be formed to include a tapered input structure, as shown in FIGS. 4 and 5, where FIG. 4 is a top view of an exemplary Schottky barrier IR photodetector arrangement 40 including a tapered silicide strip 42 and FIG. 5 is an isometric view of the same IR photodetector arrangement 40. By including a tapered input section 44 on silicide strip 42, the effective refractive index "seen" by the optical signal propagating along planar SOI layer 46 will increase gradually (instead of abruptly, as would be the case for the arrangement of FIGS. 2 and 3). The use of a taper thus allows for a more graceful transition in optical mode coupling between planar SOI layer 46 and the detector region, as well as a reduction in the amount of optical signal reflected at the barrier between the two materials. Various types of tapers (e.g., concave, convex, etc.) may be used to provide the desired gradual change in effective refractive index.

As a result of utilizing the inventive waveguide-based structure for the IR photodetector, near (or even above) room temperature operation of the photodetector is possible. In particular, the photodetector structure of the present invention has been found to improve at least four significant parameters that affect the operating temperature of the photodetector device: (1) input light flux; (2) gain and absorption; (3) responsivity; and (4) dark current, where at least two of these factors have been discussed above.

In looking at the subject of input light flux, it is known that a typical source of input light flux for a conventional normal incidence detector is a room temperature infrared scene. In comparison, the source of light in the inventive waveguide-based detector may comprise a laser or LED, allowing for a relatively high input flux. This novel waveguide geometry allows for the confinement of light into a small cross-section of the waveguide. As a result, the input flux/unit area is orders of magnitude larger than the prior art structure, providing a significant increase in input signal to dark current ratio so that detection at higher temperatures is possible. For example, the photon flux associated with 1 µW of power in a waveguide with a 0.5 µm×0.15 µm cross-sectional area is approximately six to seven orders of magnitude greater than the photon flux incident on a normal incidence detecting imaging a typical infrared scene.

As discussed above, in the inventive waveguide-based detector, the infrared light is traveling parallel to the plane of the silicide layer. As a result, a relatively large portion of the optical mode energy is traveling in the "tail" region outside of the silicon waveguide layer. Thus, the propagating light constantly interacts with the overlying silicide layer and is therefore absorbed approximately exponentially with distance along the length of the silicide strip. Additionally, as a result of the large absorption coefficient of the various silicide materials in the infrared region of interest, even a relatively thin silicide layer (less than 30 Å, for example) can absorb a large amount of light (i.e., a large number of photons) in just a few microns of travel. Therefore, the internal photoemission gain (which requires the silicide layer to be as thin as possible) can be optimized independently of the total absorption in the silicide layer. This optimization will result in significantly higher overall quantum efficiency for the inventive waveguide-based photodetector as compared to the conventional normal incidence photodetector.

The responsivity for a conventional normal incidence Schottky barrier photodetector is typically very low as compared to the responsivity of 0.80 A/W for a common InGaAs p-i-n detector. As discussed above, a photon with energy greater than the Schottky barrier height imparts energy and momentum to a free hole, turning it into a "hot" hole. The "hot" hole then loses energy via semi-elastic collisions and ultimately becomes a "cold" hole, which has a zero probability of crossing the barrier. The average distance (or length) a "hot" hole can travel before becoming "cold" is known to be a strong function of the energy of the incident photon. Therefore, in a Schottky barrier photodetector, the responsivity increases as the wavelength decreases, since the difference between the energy of the incident photon and the Schottky barrier height becomes larger (allowing the "hot" hole to travel a larger distance before losing energy to become a "cold" hole).

The waveguide-based IR photodetector of the present invention is capable of utilizing an extremely thin silicide layer, as discussed above. Therefore, a "hot" hole with a specific energy in the "thin silicide" waveguide-based detector of the present invention will have a much higher probability of emission over a barrier (as a result of the higher probability of scattering and boundary reflections for the same distance traveled for the thinner silicide layer) than the prior art normal-incidence detectors. The result is a significantly higher responsivity.

As discussed earlier, the dark current (as well as shot noise associated with the dark current required to maintain a desired dynamic range) limits the performance of the detector at a certain temperature. Indeed, the dark current is proportional to the area of the detector and is also a very strong function of temperature (as noted in Table I). Therefore, in order to operate the detector at "higher" temperatures (for example, room temperature), the overall area of the detector needs to be significantly reduced. Additionally, the relatively high electric field-related dark current generation should be avoided as much as possible. In addition to the avoidance of overlap between the silicide strip and the corners/edges of the silicon waveguide, sharp corners along the silicide strip should be reduced as much as possible. The dark current in the detector can be further reduced by the formation of a spatially homogeneous silicide layer (since silicide inhomogeneity may result in randomly dispersed regions with lower Schottky barrier heights). Inasmuch as the waveguide-based detector arrangement of the present invention allows for the propagating light to "see" an effectively larger silicide thickness (as a result of its lateral propagation along the length of the silicide), the physical area of the silicide material itself may be small. This reduction in size thus allows for the ability to operate the inventive photodetector at room temperature. In one experiment, an inventive Schottky barrier photodetector structure comprising a cobalt silicide strip with a thickness of 500 Å and an active area of approximately 20 $\mu m^2$ was able to generate a signal current of 660 pA at room temperature for approximately 500 µW of optical power (with a dark current of only about 200 pA).

Figure 6:
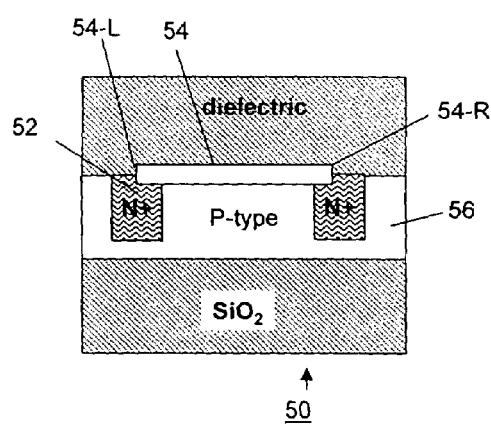
FIG. 6 is a cut-away side view of an exemplary SOI-based Schottky barrier photodetector of the present invention, incorporating a guard ring structure to reduce the presence of dark current in the device.

In a particular embodiment of the present invention, the dark current can be further reduced by forming a guard-ring structure around the perimeter of the detector (in addition to utilizing a relatively thin silicide strip). FIG. 6 is a cut-away side view of one such structure 50, where an N+-type guard ring 52 is disposed along the edges 54-L and 54-R of silicide layer 54. In this example, a planar SOI layer 56 is p-type and supports the propagation of an optical signal into the plane of the page. The presence of guard ring 52 along the edges 54-L and 54-R of silicide layer 54 reduces the electric field associated with the sharp corners of the silicide and functions as a barrier between the edges of the silicide and the waveguiding area of SOI layer 56. It is to be noted that in cases where the SOI layer is N-type, the guard ring should be P-type. The design and doping profile of a guard ring structure may be optimized, in accordance with the teachings of the present invention, to provide the desired degree of optical loss, speed, dark current and operating voltage range. Moreover, the doping of the planar SOI layer may itself be "graded" along its depth such that the resultant electric field improves the collection and transportation of the carriers injected over the Schottky barrier and into planar SOI layer 56.

It is to be understood that the silicide strip utilized to provide the metal-semiconductor interface required to create a Schottky barrier is significantly thinner than a conventional silicide layer that may be used as a contact region in conventional CMOS structures (where a conventional contact region silicide may have a nominal thickness on the order of tens of microns). However, it is possible to modify the CMOS processing steps so that only a relatively thin silicide layer is deposited to form the strip, using conventional silicide formation steps involving commonly available infrastructure/equipment in a typical CMOS fabrication facility. Further, the metallic layer used for the detector formation may be a different material than that used to form the conventional, relatively thick, silicide contact regions.

Figure 7:
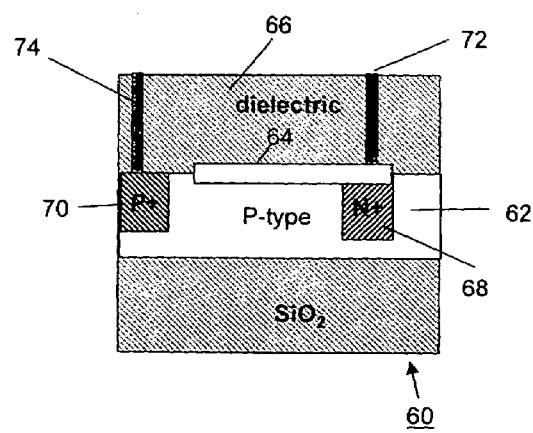
FIG. 7 is a cut-away side view of an SOI-based Schottky barrier photodetector of the present invention, illustrating an exemplary placement of the electrical contacts to both the SOI layer and the silicide strip.

Referring to FIG. 7, an exemplary arrangement for providing the required electrical contacts to both the planar SOI layer and silicide strip is shown. In this case, waveguide-based IR photodetector 60 comprises a p-type planar silicon crystal silicon SOI layer 62 with a thin silicide strip 64 disposed over planar SOI layer 62. A dielectric region 66 is formed to surround photodetector 60. One approach to providing a contact to silicide strip 64 is to have a direct contact between silicide strip 64 and a metal layer contact without any additional doping of the substrate in the contact region. It is also possible to form a contact to silicide strip 64 by allowing strip 64 to overlap a conventional silicide layer that is conventionally used for contact purposes.

Alternatively, and as illustrated in FIG. 7, an electrical contact region 68 in the form of an N+ doped region may be formed within (p-type) planar SOI layer 62 so as to be disposed underneath silicide strip 64. A P+ contact region 70 is formed in an opposing area of planar SOI layer 62 to form the electrical contact area for planar SOI layer 62. A first metal conductor 72 is illustrated as contacted to silicide strip 64, with a second metal conductor 74 contacted to P+ contact region 70. As shown in FIG. 7, both the first and second metal conductors 72 and 74 are formed through contact openings in dielectric surround 66.

The utilization of N+ contact region 68 has been found to further reduce the dark current, since contact region 68 will not contribute to the thermionic emission-based dark current. Instead, the p-n junction (formed between p-type planar SOI layer 62 and N+ contact region 68) will be in parallel with the Schottky junction formed between silicide strip 64 and SOI layer 68. Obviously, if an n-type planar SOI layer is used, a P+ contact region should be used.

Figure 8:
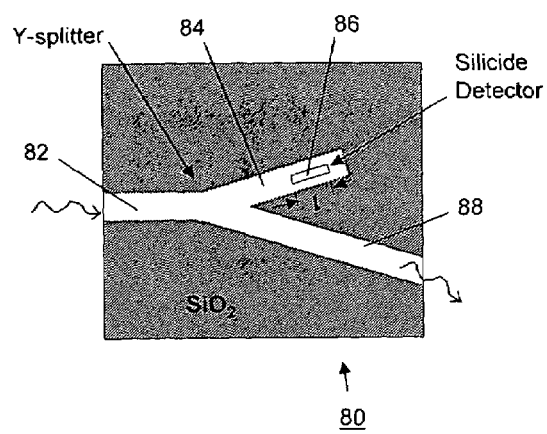
FIG. 8 is a top view of an exemplary photodetector of the present invention, comprising a Y-split waveguide with the photodetector formed along one arm of the "Y", as a tap.

A waveguide-based IR photodetector of the present invention may also be formed along a "terminated" SOI waveguide layer, the terminated layer formed as, perhaps, a "tap" from the propagating waveguide structure. FIG. 8 is a top view of one such arrangement 80, where a planar SOI layer 82 has been fabricated to exhibit a Y-splitter geometry. A first arm 84 of Y-splitting SOI layer 82 is shown as a terminated waveguide, with a silicide strip 86 disposed over a central portion of the termination. A second arm 88 is used to support the propagating optical signal as it passes along the SOI substrate. In a preferred embodiment, the majority of the optical energy will be coupled into second arm 88 so as to maintain a sufficient amount of power in the optical signal. Advantageously, since the photodetector of the present invention will absorb almost all of the photons in first arm 84 along the length l of silicide strip 86, an optical signal of a relatively small power is required to be coupled into first arm 84.

Figure 9:
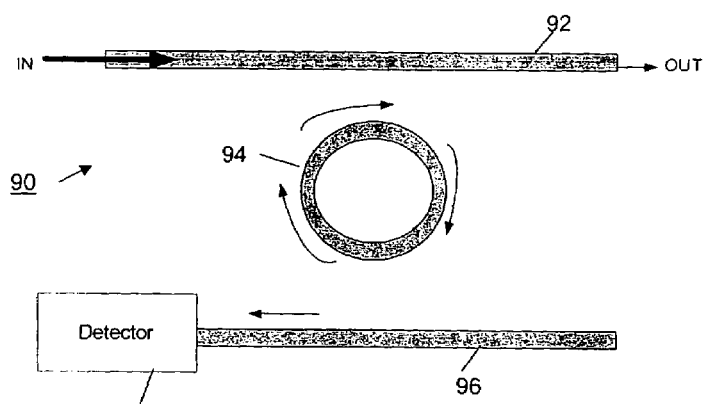
FIG. 9 is a top view of an alternative tap-off arrangement of the present invention, utilizing a waveguide-based ring resonator, with the photodetector formed at the termination of the tapped-off waveguide.
Figure 10:
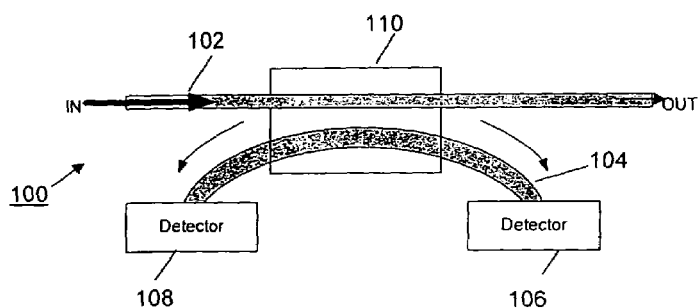
FIG. 10 is a top view of yet another tap-off arrangement of the present invention, formed as a directional waveguide coupler arrangement, including a first detector for measuring transmitted signal power and a second detector for measuring reflected signal power.

FIGS. 9 and 10 illustrate alternative "tapped" photodetector arrangements that may be formed in accordance with the present invention (bearing in mind that these arrangements are considered as exemplary only, and many other planar, waveguide-based configurations may be designed to advantageously use the silicide strip photodetector structure). Referring to FIG. 9, a photodetector arrangement 90 comprises a ring resonator structure including an input waveguide 92, a ring waveguide 94 and a tapped-off waveguide 96. A detector 98 formed in accordance with the present invention is disposed along a portion of tapped-off waveguide 96. In accordance with the well-known principles of ring resonator structures, an optical signal of a predetermined wavelength will be evanescently coupled into ring waveguide 94 as it propagates along input waveguide 92. The optical signal at this particular wavelength will then move in a counter-propagating direction along tapped-off waveguide 96 (as indicated by the arrows in FIG. 9) and then be coupled into photodetector 98. Advantageously, the various planar waveguides and the inventive photodetector may all be formed as a monolithic arrangement within the same SOI structure, thus significantly reducing signal loss and reflections between elements. In an extension of the arrangement of FIG. 9, a plurality of such "rings" may be disposed along the expanse between input waveguide 92 and tapped-off waveguide 96, each ring "tuned" to out-couple a different waveguide. A like plurality of photodetectors of the present invention may be dispersed along tapped-off waveguide 96 and thus form a multiple-wavelength photodetector. It is to be noted that the above-described multi-wavelength embodiment is exemplary only, and various other multi-wavelength photodetector array configurations may be formed. For example, multi-wavelength photodetector structures based on Echelle gratings or linear waveguide grating structures (as well as waveguide-based Roland circles) may be formed using the inventive silicide strip photodetector arrangement.

FIG. 10 contains a diagram of a coupled waveguide photodetector arrangement 100 of the present invention, comprising a pair of coupled waveguides 102 and 104, with a first photodetector 106 disposed along waveguide 104 to measure the transmitted power of the optical signal and a second photodetector 108 disposed along waveguide 104 (in the opposite direction) to measure the reflected power of the optical signal. As shown, a waveguide-based coupling region 110 is formed between waveguides 102 and 104 so as to evanescently couple a portion of the propagating input signal into waveguide 104, where a portion of the optical signal will remain within waveguide 102 and thereafter exit waveguide 102 as the optical output signal. The portion of optical energy coupled into waveguide 104 can be controlled by the waveguide fabrication process so as to allow for a desired power level to remain in the optical output signal.

Figure 11:
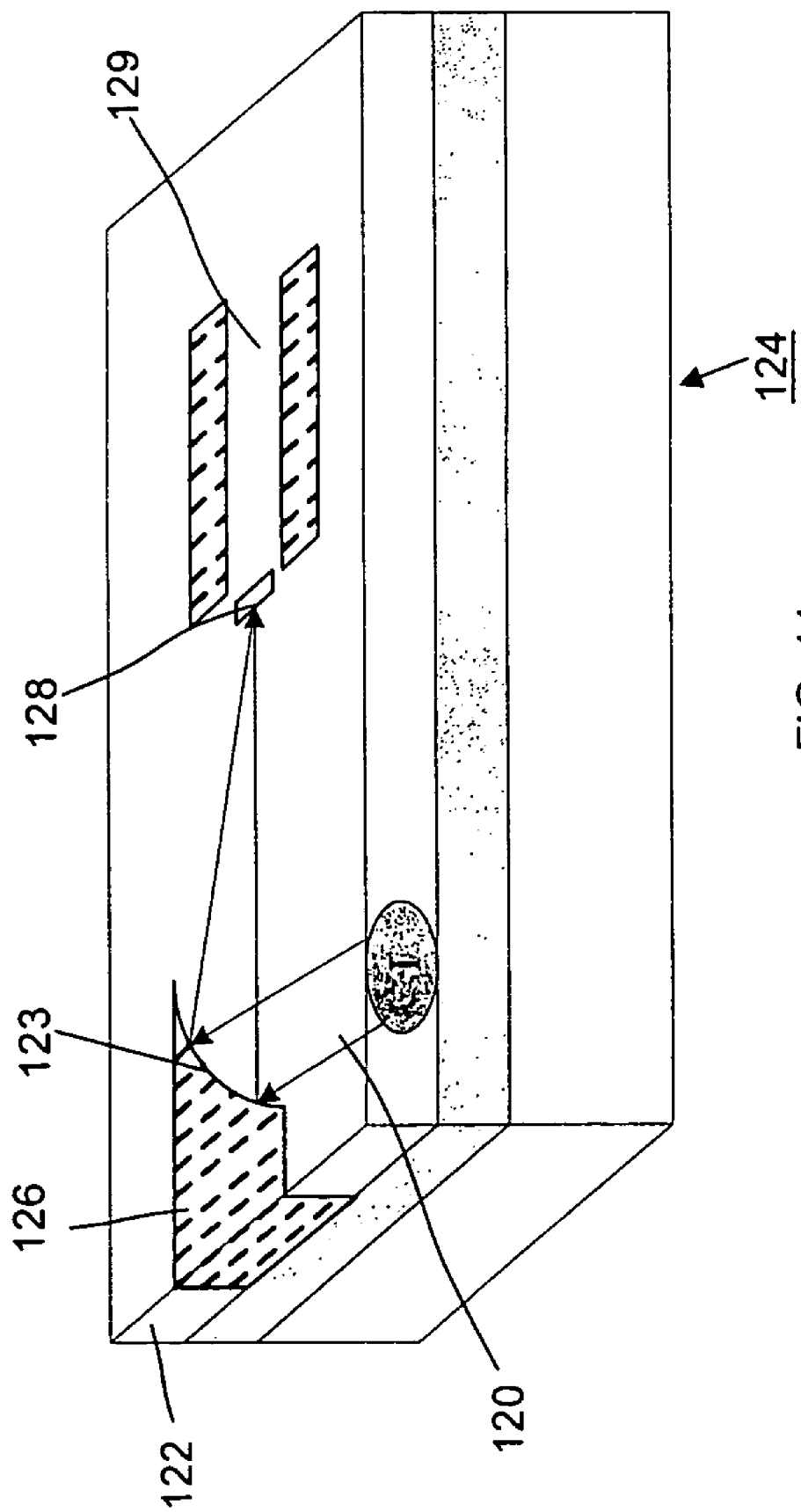
FIG. 11 contains a top view of a "focused input" SOI-based photodetector of the present invention, utilizing a parabolic reflective arrangement formed in the SOI layer to re-direct and focus an input optical signal into a relatively small surface area silicide strip photodetector and reduce dark current.

Another advantage of the waveguide-based detector of the present invention is the ability to concentrate light in a very small area. The waveguide detector structure can be fabricated, for example, on a photonic wire or other integrated optical components (such as waveguide mirrors or lenses), which can be used to focus light into an extremely small area, thus reducing the active area (and, as a result, the dark current) of the waveguide detector. FIG. 11 contains an isometric view of one exemplary arrangement illustrating this advantage. As shown, a collimated optical input beam I propagates along a slab waveguide 120 formed within a planar SOI layer 122 of an SOI structure 124. The propagating beam then impinges a reflective parabolic mirror structure 123 formed by etching away a selected portion of planar SOI layer 122. Thereafter, a dielectric material 126 is disposed within the etched region to re-planarize the arrangement and create an optical boundary with parabolic mirror structure 123. The reflected optical beam from parabolic mirror structure 123 is then focused, as shown in FIG. 11, into a relatively small silicide strip 128 of the inventive photodetector. Advantageously, the focusing of the input optical signal significantly increases the energy absorbed per unit area of silicide strip 128 and likewise reduces the area, and hence the dark current, of the detector. The detector can be designed to absorb all of the optical signal. Alternatively, the detector can be designed in a traveling wave configuration.

In a traveling wave configuration of the inventive detector structure, a silicide strip is disposed on a waveguide that is particularly designed so as to absorb only a small fraction of the light, while allowing the remaining portion of the input light to continue propagating through the waveguide. The absorption of light along the length of the thin silicide strip is nearly an exponential function and, therefore, an extremely small length may be used to absorb a small fraction of the total optical signal passing through the waveguide. Thus, the traveling waveguide implementation of the photodetector of the present invention allows for the use of an extremely small detector area, significantly reducing dark current generation. Indeed, the focusing mirror-based detector configuration of FIG. 11 can also be used in a traveling wave configuration in which the unabsorbed optical signal will thereafter continue to propagate along optical waveguide 129 (in this case illustrated as a photonic wire 129).

Figure 12:
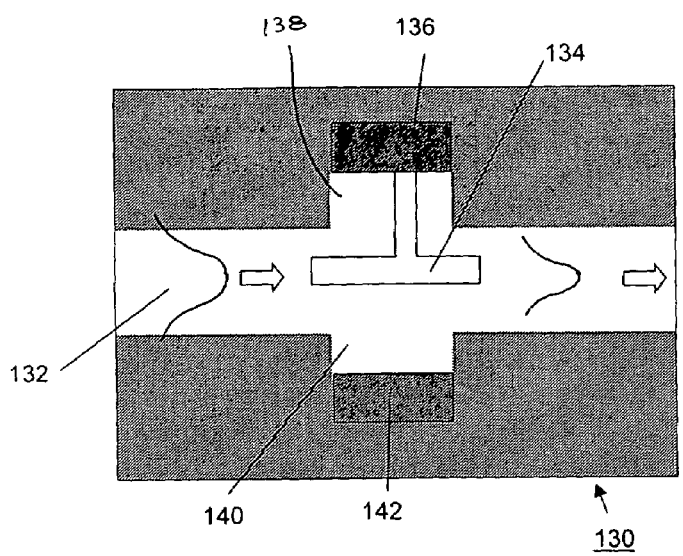
FIG. 12 is a top view of an exemplary traveling wave Schottky barrier photodetector formed in accordance with the present invention.
Figure 13:
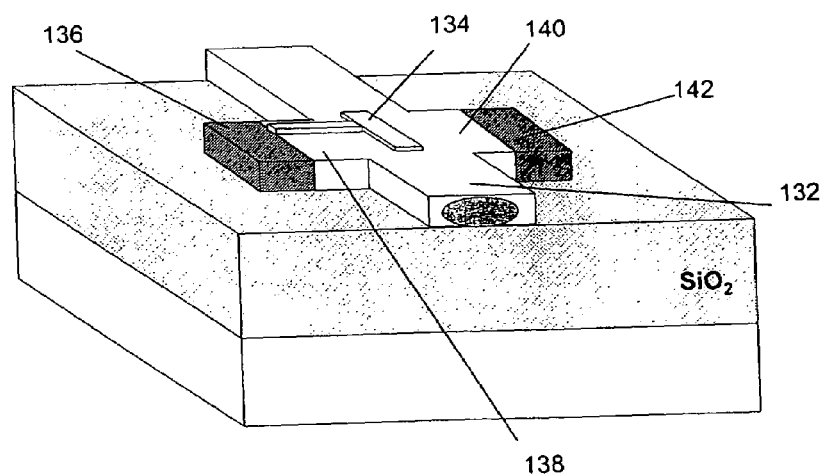
FIG. 13 is an isometric view of the traveling wave photodetector of FIG. 12.

Another exemplary traveling waveguide detector arrangement 130 of the present invention is illustrated in a top view FIG. 12, where FIG. 13 is an isometric view of detector 130. As shown, an optical signal is coupled into a planar strip waveguide SOI layer 132. A relatively thin silicide strip 134 is disposed over a predetermined portion of strip waveguide 132. A first contact region 136 is formed to silicide strip 134, where as illustrated in FIGS. 12 and 13, planar SOI layer 132 is formed to include a first extension region 138, with first contact region 136 disposed on first extension region 138 to minimize absorption of the optical signal in the contact region. Similarly, planar SOI layer 132 is formed to include a second extension region 140 (preferably disposed in opposition to first extension region 138 with respect to strip waveguide layer 132) to support a second contact region 142, second contact region 142 used to provide contact to SOI layer 132 itself. It is to be understood that this particular embodiment as shown in FIGS. 12 and 13 is exemplary only, with various other extension region configurations possible to minimize the radiation and reflection losses. Any such variation in design is considered to fall within the spirit and scope of the present invention.

Figure 14:
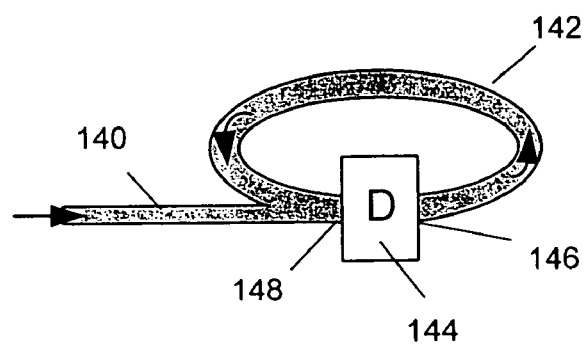
FIG. 14 is a top view of an exemplary multi-pass photodetector of the present invention, utilizing a circular waveguide structure to re-introduce uncoupled light back into the photodetector on each pass.

In order to minimize the surface area of the silicide strip of the inventive detector (desired to reduce the unwanted dark current), the detector can be formed in a "multi-pass" configuration, in which the length of the detector (along which the traveling light is absorbed) is minimized, with a portion of the unabsorbed light (i.e., the light which passes through the detector unaffected) being re-launched into the detector region. FIG. 14 illustrates one exemplary arrangement of forming a multi-pass waveguide-based IR detector of the present invention. In this arrangement, a planar SOI waveguiding layer 140 is formed to include a circular section 142, with a silicide strip photodetector 144 of the present invention disposed as shown within circular section 142. In this arrangement, the unabsorbed light exiting detector 144 at output port 146 will propagate along circular section 142 and be re-launched into detector 144 at its input port 148.

Figure 15:
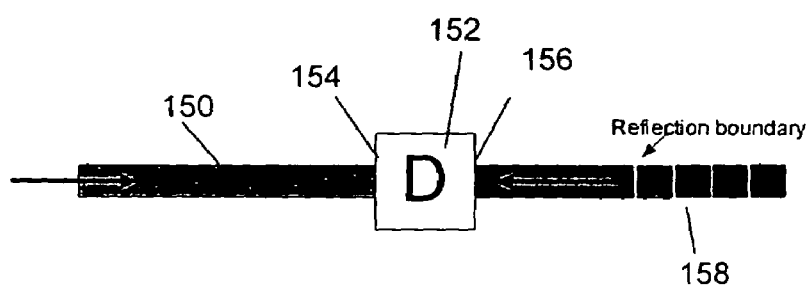
FIG. 15 is a top view of an alternative multi-pass photodetector structure, utilizing a reflecting element beyond the output of the photodetector for re-introducing uncoupled light back into the photodetector.

An alternative multi-pass arrangement is illustrated in FIG. 15, where an optical signal propagating along a planar SOI layer waveguide 150 is introduced into a silicide strip photodetector 152 at its input port 154. The unabsorbed portion of the optical signal will then exit photodetector 152 at output port 156. Thereafter, the unabsorbed optical signal will impinge a reflection boundary 158 (for example, a grating structure), which will then re-direct the optical signal back along waveguide 150 and into output port 156 so as to pass a second time through photodetector 152, allowing an additional portion of the optical signal to be absorbed in silicide strip photodetector 152 and generate an associated photocurrent. In an alternative embodiment, the inventive photodetector may be placed in the center of a waveguide-based Fabry-Perot cavity. Various other multi-pass arrangements are possible, where any of these variations is considered to fall within the spirit and scope of the present invention.

Figure 16:
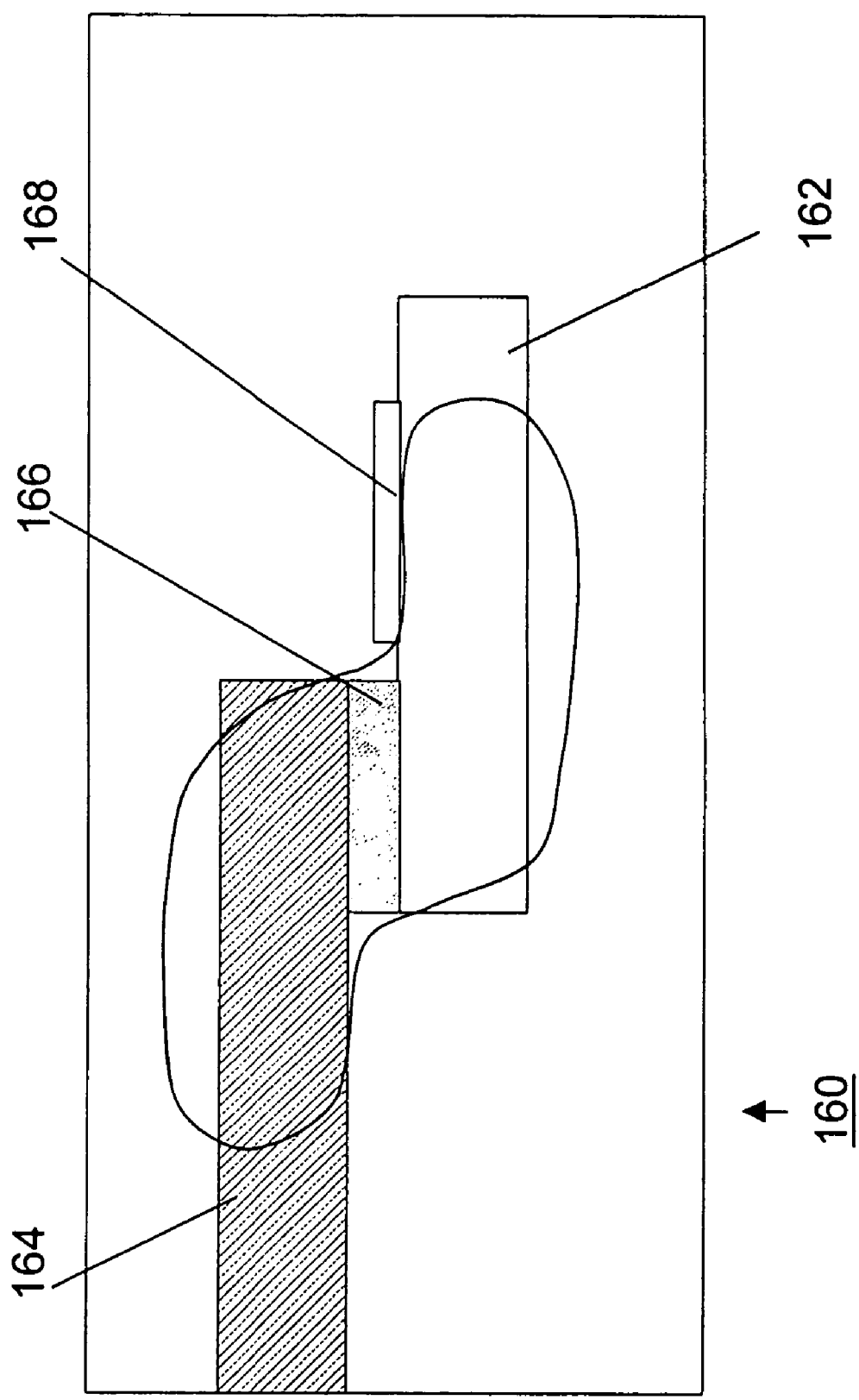
FIG. 16 illustrates an exemplary "integrated" SOI structure wherein a photodetector of the present invention is formed as a monolithic structure with another optoelectronic element.

Advantageously, the waveguide-based IR photodetector of the present invention may be incorporated with various other optoelectronic devices that have been developed on the SOI platform. FIG. 16 illustrates one exemplary arrangement, where an optical device 160 comprises a planar SOI waveguiding layer 162 and a polysilicon layer 164, with polysilicon layer 164 disposed so as to overlap a portion of planar SOI layer 162 in the region where an optical mode will be supported. A relatively thin gate dielectric region 166 is formed as an interface between the overlapping regions of these two layers. As shown, a silicide strip 168 is formed over an exposed portion of SOI layer 162, sufficiently close to the overlapped area so that (as before) a "tail" portion of the optical mode will intercept the silicide and produce a photocurrent (the necessary electrical contacts not shown in this particular embodiment). Various other configurations, similar in function to that of FIG. 16 may be formed to also include a waveguide-based photodetector of the present invention, where a number of these other configurations are disclosed in applicants' co-pending application Ser. No. 10/795,748, filed Mar. 8, 2004 and Ser. No. 10/806,738, filed Mar. 23, 2004. Generally speaking, the silicide strip of the inventive photodetector may be disposed over an SOI layer of virtually any poly-loaded waveguide structure so as to form a monolithic optical arrangement.

Figure 17:
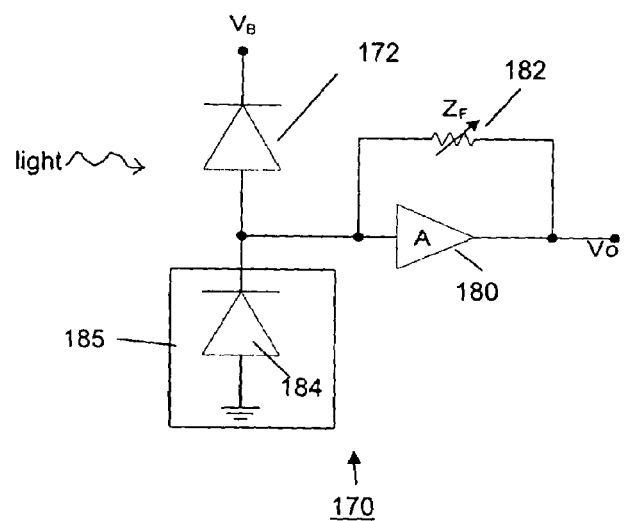
FIG. 17 contains a simplified circuit diagram illustrating the use of a "dummy" photodetector (i.e., photodetector with no optical input signal) in association with a photodetector of the present invention, so as to cancel dark current.
Figure 18:
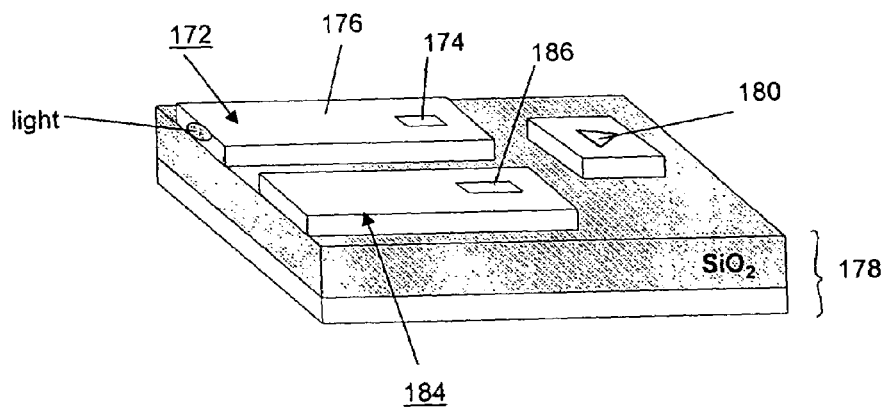
FIG. 18 is an isometric view of an exemplary embodiment of the circuit of FIG. 17, illustrating the ability to integrate the dummy photodetector and associated electronics with the SOI-based photodetector of the present invention.

FIG. 17 illustrates another exemplary optoelectronic arrangement 170 incorporating the SOI-based silicide strip photodetector of the present invention with, in this case, an amplifier structure that may also be formed within the SOI structure. FIG. 18 is an isometric view of exemplary amplifier arrangement 170. As shown, arrangement 170 comprises a silicide strip photodetector 172 formed in accordance with the present invention, including a silicide strip 174 disposed over a portion of an SOI layer 176 of an SOI structure 178 (as illustrated particularly within FIG. 18). The photocurrent output from photodetector 172 is thereafter applied as an input to a transimpedance amplifier 180 which functions to convert the input current into an output voltage. Amplifier 180 also includes a feedback biasing element 182 to adjust the "gain" factor of amplifier 180. Inasmuch as the fabrication of transimpedance amplifiers is a relatively straightforward CMOS process, such an amplifier may be easily integrated with inventive photodetector 172. Advantageously, a "dummy" photodetector 184 may also be integrated with photodetector 172 and used, as shown, to reduce input noise associated with dark current by balancing the photocurrent input applied to transimpedance amplifier 180. Referring to FIG. 18, a second silicide strip 186 is illustrated as disposed parallel to first silicide strip 174, where no input optical signal is coupled into the region of SOI layer 176 associated with second strip 186. Therefore, any photocurrent detected by second silicide strip 186 would be a "noise" (dark current) signal that may be subtracted from the photocurrent output of photodetector 172 prior to applying the photocurrent as an input to amplifier 180. The addition of diode 184 enables the dark current of photodetector 172 to be subtracted from the overall signal current. This results in increasing the low current sensitivity of the arrangement for situations where the ratio of the actual signal current to the dark current is relatively low. Special care should be taken to reduce the mismatch between detectors 172 and 184, where detector 184 should be shielded (see element 185) from "stray" light that may result in an undesired photocurrent. The shield can be achieved by placing highly absorptive regions (such as metal lines, silicides regions and/or highly doped regions) around and above the dummy detector. The voltage across detectors 172 and 184 should also be substantially equal so as to remove the bias dependence of the dark current.

Figure 20:
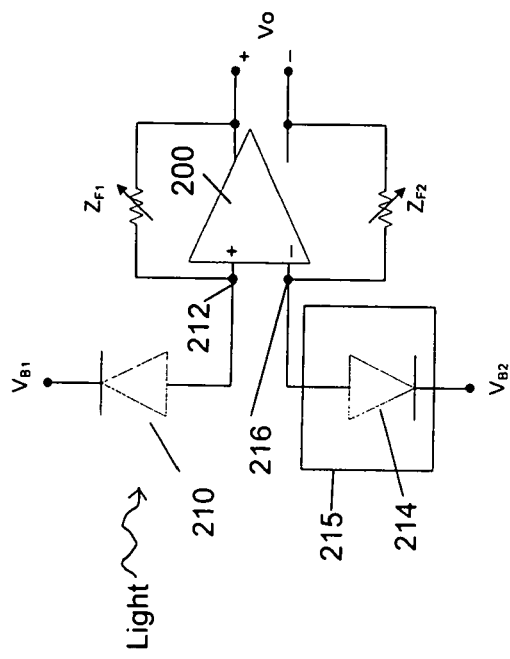
FIG. 20 contains a simplified circuit diagram of yet another arrangement employing a "dummy" photodetector using a single differential amplifier.
Figure 19:
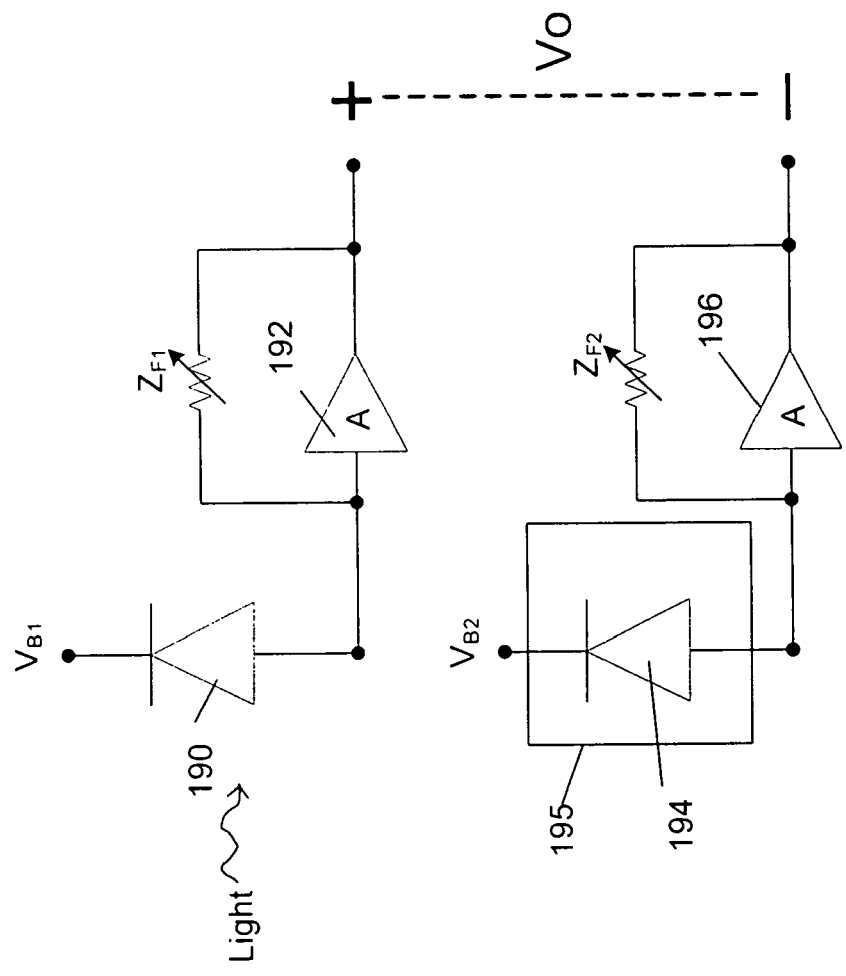
FIG. 19 contains a simplified circuit diagram of an alternative arrangement utilizing a "dummy" photodetector that may be integrated in the same SOI structure as the inventive photodetector to provide a reference "dark current" to a differential amplifier structure.

FIG. 19 contains a schematic diagram of another arrangement utilizing a "dummy" detector integrated with the inventive silicide strip photodetector, where in this case, the photocurrent output from the inventive silicide strip photodetector 190 is applied as an input to a first, integrated transimpedance amplifier 192 and the "photocurrent" (noise) output from a "dummy" photodetector 194 is applied as an input to a second, integrated transimpedance amplifier 196. The "differential" voltage output from amplifiers 192 and 196 will thus remove any dark current-related voltage from the output signal. FIG. 20 illustrates yet another arrangement utilizing a "dummy" photodetector, in this case with a differential amplifier 200, with an inventive silicide strip photodetector 210 being coupled to a first input 212 of amplifier 200 and a "dummy" photodetector 214 being coupled to a second input 216 of amplifier 200. Again, the output voltage generated by amplifier 200 will be independent of the dark current value.

It is to be noted that all of the above-described amplifiers use input bias current cancellation techniques that are well known in the art. Further, the feedback elements may be trimmed to eliminate amplifier off-sets. Multiple "dummy" detectors may also be used to average the dark current value.

Various detector configurations described hereinabove can be operated in continuous detection mode, signal integration mode or synchronous detection mode. As the detector structure can be fabricated using CMOS fabrication processes, using an on-chip clock-data-recovery (CDR) circuit, synchronous detection of very high speed data signals (in excess of 10 Gb/s) can be achieved.

It is to be understood that the above-described embodiments of the present invention are considered to be exemplary only and should be considered to define or limit the scope of the present invention, as defined by the claims appended hereto:

What is claimed is:

1. A monolithic arrangement comprising a Schottky barrier, silicon-based infrared photodetector integrated on a silicon-on-insulator (SOI) platform with an optical waveguide, the monolithic arrangement including an SOI structure with a planar SOI surface layer, the planar SOI surface layer being less than one micron in thickness and forming at least a portion of the optical waveguide for supporting transmission of an optical signal;

a metallic strip disposed over a portion of the planar SOI surface layer along the direction of propagation within the optical waveguide, the metallic strip forming a Schottky barrier with the optical waveguide;

a first ohmic contact disposed on the planar SOI surface layer at a first contact area; and a second ohmic contact disposed on the metallic strip at a second contact area, wherein the application of a bias voltage between the first and second ohmic contacts generates a photocurrent output from the metallic strip as a function of the portion of the optical signal that impinges the metallic strip as said optical signal propagates along said optical waveguide, the first and second ohmic contacts disposed to minimize the absorption of said optical signal in the first and second contact areas.

2. A monolithic arrangement as defined in claim 1 wherein the planar SOI surface layer comprises a single crystal silicon.

3. A monolithic arrangement as defined in claim 1 wherein the planar SOI surface layer comprises strained lattice crystalline silicon.

4. A monolithic arrangement as defined in claim 1 wherein the planar SOI surface layer comprises Si—Ge.

5. A monolithic arrangement as defined in claim 1 wherein the first and second ohmic contacts are disposed at substantially the same distance above the top surface of the planar SOI surface layer.

6. A monolithic arrangement as defined in claim 1 wherein the metallic strip does not overlap any corners or edges of the planar SOI surface layer, the nonoverlapping arrangement for reducing the associated dark current and providing room temperature operation.

7. A monolithic arrangement as defined in claim 1 wherein the metallic strip is formed to exhibit rounded corner and edges so as to reduce the associated dark current and provide room temperature operation.

8. A monolithic arrangement as defined in claim 1 wherein the planar SOI surface layer is doped.

9. A monolithic arrangement as defined in claim 8 wherein the planar SOI surface layer is p-doped.

10. A monolithic arrangement as defined in claim 8 wherein the planar SOI surface layer is n-doped.

11. A monolithic arrangement as defined in claim 8 wherein the doping within the planar SOI surface layer is graded such that the resultant electric field improves the collection and transportation of carriers injected over the Schottky barrier into the planar SOI surface layer.

12. A monolithic arrangement as defined in claim 1 wherein the metallic strip comprises a silicide strip.

13. A monolithic arrangement as defined in claim 12 wherein the silicide comprises a monocrystalline silicide.

14. A monolithic arrangement as defined in claim 12 wherein the silicide comprises a polycrystalline silicide.

15. A monolithic arrangement as defined in claim 12 wherein the silicide strip is formed using a metal selected from the group consisting of:

platinum, cobalt, titanium, tantalum, tungsten, nickel, and molybdenum.

16. A monolithic arrangement as defined in claim 15 wherein the silicide strip comprises cobalt silicide.

17. A monolithic arrangement as defined in claim 1 wherein the first and second ohmic contacts each comprise a silicide material.

18. A monolithic arrangement as defined in claim 17 wherein the first and second silicide ohmic contacts and the metallic strip all comprise a same silicide material.

19. A monolithic arrangement as defined in claim 17 wherein the first and second silicide ohmic contacts comprise a first silicide and the metallic strip comprises a second silicide material.

* * * * *